(12) United States Patent
Kugimoto et al.

(10) Patent No.: US 11,837,489 B2
(45) Date of Patent: Dec. 5, 2023

(54) ELECTROSTATIC CHUCK DEVICE AND PRODUCTION METHOD FOR ELECTROSTATIC CHUCK DEVICE

(71) Applicant: SUMITOMO OSAKA CEMENT CO., LTD., Tokyo (JP)

(72) Inventors: Hironori Kugimoto, Tokyo (JP); Norito Morishita, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 422 days.

(21) Appl. No.: 16/981,622

(22) PCT Filed: Mar. 22, 2019

(86) PCT No.: PCT/JP2019/012050
§ 371 (c)(1),
(2) Date: Sep. 16, 2020

(87) PCT Pub. No.: WO2019/182104
PCT Pub. Date: Sep. 26, 2019

(65) Prior Publication Data
US 2021/0020489 A1    Jan. 21, 2021

(30) Foreign Application Priority Data
Mar. 23, 2018    (JP) ................. 2018-055619

(51) Int. Cl.
*H01L 21/683*    (2006.01)
*H01J 37/32*    (2006.01)
*H01L 21/687*    (2006.01)

(52) U.S. Cl.
CPC .... *H01L 21/6833* (2013.01); *H01J 37/32724* (2013.01); *H01L 21/68757* (2013.01)

(58) Field of Classification Search
CPC ........... H01L 21/6833; H01L 21/68757; H01L 21/3065; H01J 37/32724; H01J 37/32715; B23Q 3/15; H02N 13/00
See application file for complete search history.

(56) References Cited

U.S. PATENT DOCUMENTS 4,743,411 A * 5/1988 Shimada ................ C08G 77/60
264/211.17
11,273,526 B1 * 3/2022 Johnson ............... B05B 13/0431
(Continued)

FOREIGN PATENT DOCUMENTS

JP    2000332090 A  * 11/2000
JP    2007-311399 A    11/2007
(Continued)

OTHER PUBLICATIONS

International Search Report for PCT/JP2019/012050 (dated Jun. 4, 2019).

*Primary Examiner* — Jarrett J Stark
(74) *Attorney, Agent, or Firm* — Merchant & Gould P.C.

(57) ABSTRACT

The electrostatic chuck device includes: a base having one main surface serving as a mounting surface on which a plate-shaped sample is mounted; and an electrode for electrostatic attraction provided on a side opposite to the mounting surface in the base or in an interior of the base, in which the electrode for electrostatic attraction is made of a composite sintered body that includes a matrix phase having insulation properties and a dispersed phase having a lower volume resistivity value than the matrix phase, in any cross section of the composite sintered body, a region of the dispersed phase, which is surrounded by the matrix phase and is independent, includes aggregated portions having a maximum Feret diameter of 30 μm or more, and one or more (Continued)

of the aggregated portions are present in a range of 2500 μm$^2$ in any cross section of the sintered body.

18 Claims, 4 Drawing Sheets

(56) References Cited

U.S. PATENT DOCUMENTS

| | | | | |
|---|---|---|---|---|
| 2014/0376148 | A1* | 12/2014 | Sasaki | B23Q 3/15 |
| | | | | 361/234 |
| 2016/0251265 | A1* | 9/2016 | Takahashi | H01L 21/6833 |
| | | | | 361/234 |
| 2017/0140969 | A1* | 5/2017 | Kuo | H01L 21/6833 |
| 2017/0243778 | A1* | 8/2017 | Kouno | H01L 21/6833 |
| 2018/0005860 | A1* | 1/2018 | Miyamoto | H01L 21/6833 |
| 2020/0227300 | A1* | 7/2020 | Lee | H01L 21/6875 |
| 2020/0350196 | A1* | 11/2020 | Nagai | H01B 3/12 |
| 2020/0395235 | A1* | 12/2020 | Hayahara | H01L 21/6875 |
| 2020/0407279 | A1* | 12/2020 | Atsuji | H01L 21/68757 |
| 2021/0013081 | A1* | 1/2021 | Kosakai | H01L 21/6831 |
| 2021/0114937 | A1* | 4/2021 | Hidaka | C04B 35/645 |
| 2021/0134639 | A1* | 5/2021 | Atsuji | H01L 21/68757 |
| 2021/0249260 | A1* | 8/2021 | Kim | H01L 21/68757 |
| 2021/0268616 | A1* | 9/2021 | Sato | B23Q 3/15 |
| 2021/0335644 | A1* | 10/2021 | Minemura | H01L 23/49866 |
| 2022/0013341 | A1* | 1/2022 | Minemura | H10N 10/17 |
| 2022/0081365 | A1* | 3/2022 | Atsuji | C04B 35/117 |
| 2022/0084865 | A1* | 3/2022 | Miyanishi | B32B 37/06 |
| 2022/0189746 | A1* | 6/2022 | Mun | H01L 21/68785 |
| 2022/0223455 | A1* | 7/2022 | Hidaka | H01L 21/67109 |

FOREIGN PATENT DOCUMENTS

| | | | |
|---|---|---|---|
| JP | 2016086081 A | * | 5/2016 |
| JP | 2017183467 A | * | 10/2017 |
| JP | 6424563 B2 | * | 11/2018 |

* cited by examiner

ELECTROSTATIC CHUCK DEVICE AND PRODUCTION METHOD FOR ELECTROSTATIC CHUCK DEVICE

TECHNICAL FIELD

The present invention relates to an electrostatic chuck device and a production method for an electrostatic chuck device. This application is a U.S. National Stage Application under 35 U.S.C. § 371 of International Patent Application No. PCT/JP2019/012050, filed on Mar. 22, 2019, which claims priority to Japanese Patent Application No. 2018-055619 filed in Japan on Mar. 23, 2018, the disclosures of all of which are hereby incorporated by reference in their entireties.

BACKGROUND

In recent years, in a semiconductor manufacturing apparatus that performs a plasma process, an electrostatic chuck device capable of easily fixing a plate-shaped sample (wafer) has been used. The electrostatic chuck device includes a base and an electrode for electrostatic attraction. The base has one main surface serving as a mounting surface on which the wafer can be mounted. The electrode for electrostatic attraction generates an electrostatic force (Coulomb's force) between itself and the wafer mounted on the mounting surface.

As a material for forming the electrode for electrostatic attraction, an electrically conductive composite sintered body such as aluminum oxide-molybdenum carbide or aluminum oxide-tantalum carbide is known (refer to, for example, Patent Literature No. 1).

CITATION LIST

Patent Literature

[Patent Literature No. 1] Japanese Laid-open Patent Publication No. 2007-311399

SUMMARY OF INVENTION

Technical Problem

The material for forming the electrode for electrostatic attraction disclosed in Patent Literature No. 1 includes electrically conductive carbide such as molybdenum carbide or tantalum carbide. Since the carbide has a high melting point, it is difficult to be sintered. If sintering is insufficient in the composite sintered body that is the material for forming the electrode for electrostatic attraction, crystal grain boundaries increase, and thus a volume resistivity tends to increase.

In order to allow a wafer to be favorably attracted and detached, it is preferable that the volume resistivity of the electrode for electrostatic attraction is low.

Therefore, in the material for forming the electrode for electrostatic attraction of the related art, there is a case where a method of promoting sintering is adopted. In order to promote the sintering of the material for forming the electrode for electrostatic attraction, for example, a method of increasing a sintering temperature at the time of the production of the forming material, a method of increasing the abundance ratio of aluminum oxide which has an action of promoting sintering, or the like is performed.

However, if the method of increasing a sintering temperature is performed, aluminum oxide evaporates. For this reason, rather, there is a case where it becomes difficult to obtain a good sintered body. Further, if the abundance ratio of aluminum oxide is increased, the abundance ratio of carbide having electrical conductivity is relatively lowered. For this reason, a volume resistivity tends to increase.

The present invention has been made in view of such circumstances and has an object to provide an electrostatic chuck device having a novel electrode for electrostatic attraction having a low volume resistivity. Further, the present invention has an object to a production method for an electrostatic chuck device, which makes it possible to easily produce an electrode for electrostatic attraction having a low volume resistivity.

Solution to Problem

In order to solve the above problems, according to a first aspect of the present invention, there is provided an electrostatic chuck device including: a base having one main surface serving as a mounting surface on which a plate-shaped sample is mounted; and an electrode for electrostatic attraction provided on a side opposite to the mounting surface in the base or in an interior of the base, in which the electrode for electrostatic attraction is made of a composite sintered body that includes a matrix phase having insulation properties and a dispersed phase having a lower volume resistivity value than the matrix phase, in any cross section of the composite sintered body, a region of the dispersed phase, which is surrounded by the matrix phase and is independent, includes aggregated portions having a maximum Feret diameter of 30 μm or more, and one or more of the aggregated portions are present in a range of 2500 μm$^2$ in any cross section of the composite sintered body.

In an aspect of the present invention, the matrix phase may be configured to include aluminum oxide.

In an aspect of the present invention, the dispersed phase may be configured to include molybdenum, carbon, and silicon.

In an aspect of the present invention, a thickness of the electrode for electrostatic attraction may be 0.1 μm or more and 100 μm or less.

In an aspect of the present invention, the matrix phase may be composed of one or more of aluminum oxide ($Al_2O_3$), yttrium oxide ($Y_2O_3$), yttrium aluminum garnet (YAG), samarium aluminate ($SmAlO_3$), aluminum nitride (AlN), silicon nitride ($Si_3N_4$), magnesium oxide (MgO), calcium oxide (CaO), titanium oxide ($TiO_2$), and zirconium oxide ($ZrO_2$).

In an aspect of the present invention, the dispersed phase may be composed of metal carbide and/or metal silicide.

In an aspect of the present invention, the matrix phase may be substantially composed of aluminum oxide.

In an aspect of the present invention, the dispersed phase may be substantially composed of molybdenum, carbon, and silicon.

Further, according to a second aspect of the present invention, there is provided a production method for an electrostatic chuck device including: a step of preparing mixed particles in which silicon carbide particles and/or silicon oxide particles are further added to a mixture of aluminum oxide particles and molybdenum carbide particles; a step of forming the mixed particles to obtain a formed body; a first heat treatment step of heating the formed body to a temperature of 400° C. or higher and 1300° C. or lower in a vacuum atmosphere; and a second heat treatment step of heating the formed body to a temperature of 1500° C. or higher in an inert gas atmosphere after the first heat treatment step.

Advantageous Effects of Invention

According to the present invention, it is possible to provide an electrostatic chuck device provided with a novel electrode for electrostatic attraction having a low volume resistivity. Further, it is possible to provide a production method for an electrostatic chuck device, which makes it possible to easily produce an electrode for electrostatic attraction having a low volume resistivity.

DESCRIPTION OF EMBODIMENTS

Hereinafter, a preferred example of an electrostatic chuck device according to the present embodiment will be described with reference to FIG. 1. In all the following drawings, in order to make the drawings easy to see, the dimension, ratio, or the like of each constituent element is appropriately varied. The present invention is not limited to an embodiment which will be described below, and can be appropriately modified and implemented within a scope in which the effects of the present invention are exhibited. For example, it is possible to omit, add, or change the number, a numerical value, an amount, a ratio, a characteristic, or the like within a scope which does not depart from the gist of the present invention.

[Electrostatic Chuck Device]

Figure 1:
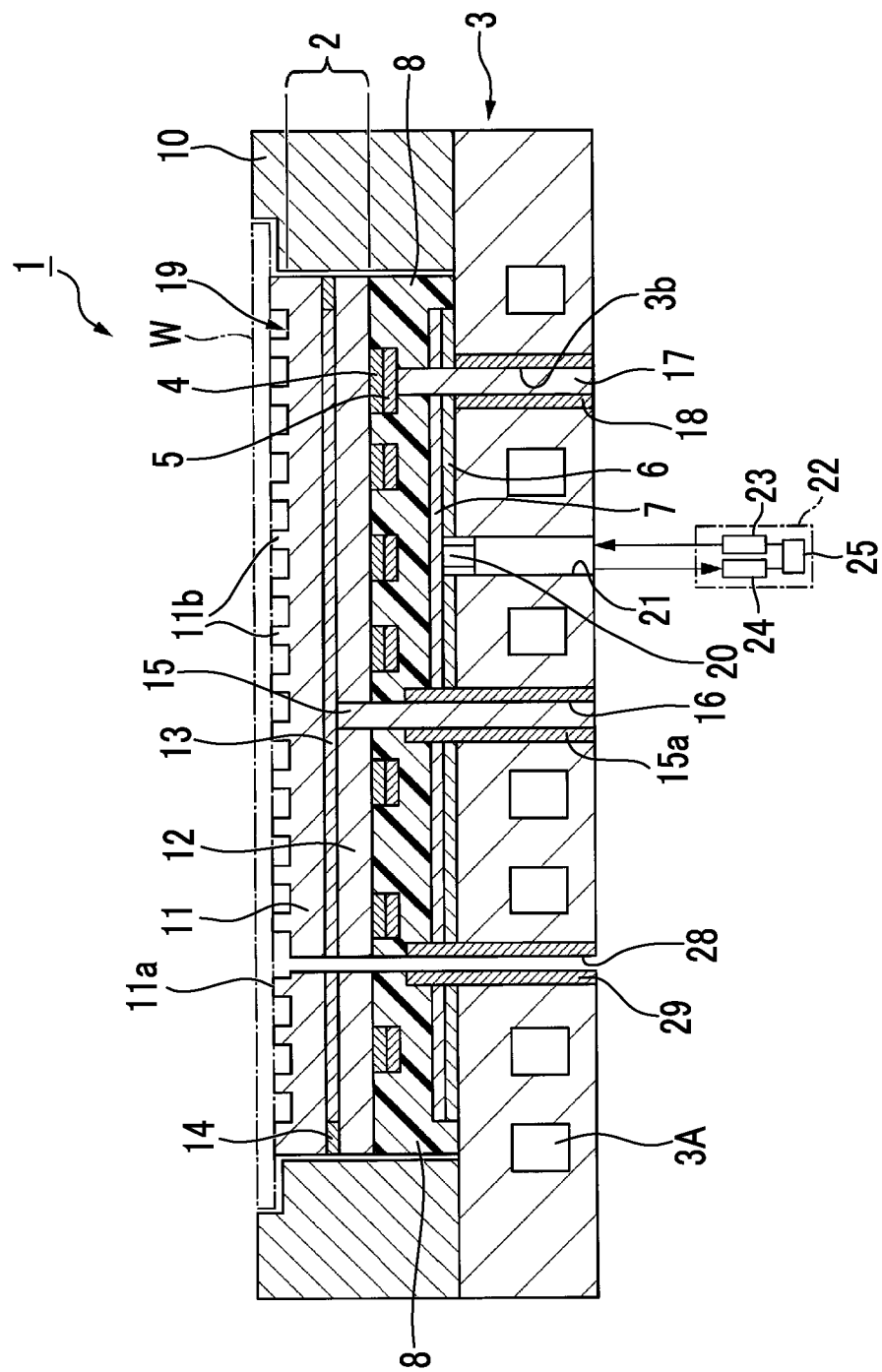
FIG. 1 is a schematic sectional view showing an example of an electrostatic chuck device of the present embodiment.

FIG. 1 is a sectional view showing an example of an electrostatic chuck device of the present embodiment. An electrostatic chuck device 1 shown in FIG. 1 includes an electrostatic chuck part 2 and a temperature adjusting base part 3 provided below the electrostatic chuck part 2 and having a disk shape when viewed in a plan view. The electrostatic chuck part 2 and the temperature adjusting base part 3 are bonded to each other through an adhesive layer 8 provided between the electrostatic chuck part 2 and the temperature adjusting base part 3. The electrostatic chuck part 2 has a disk shape when viewed in a plan view and has a mounting surface on the one main surface (upper surface) side. The temperature adjusting base part 3 is thick and can adjust the temperature of the electrostatic chuck part 2 to a desired temperature.

Hereinafter, these constituent elements will be described in order.

(Electrostatic Chuck Part)

The electrostatic chuck part 2 has a mounting plate 11, a supporting plate 12 integrated with the mounting plate 11, and an electrode for electrostatic attraction 13 and an insulating material layer 14 provided between the mounting plate 11 and the supporting plate 12. A plate-shaped sample W such as a semiconductor wafer is mounted on the upper surface of the mounting plate 11. The supporting plate 12 supports the bottom portion side of the mounting plate 11. Each of the mounting plate 11 and the supporting plate 12 corresponds to a "base" in the present invention. The insulating material layer 14 insulates the surroundings of the electrode for electrostatic attraction 13.

The mounting plate 11 and the supporting plate 12 are disk-shaped members. In the mounting plate 11 and the supporting plate 12, the shapes of superimposed surfaces are the same. Each of the mounting plate 11 and the supporting plate 12 is made of a ceramic sintered body having mechanical strength and durability against corrosive gas and plasma thereof. The mounting plate 11 and the supporting plate 12 will be described in detail later.

A plurality of projection portions 11b are formed at predetermined intervals on a mounting surface 11a of the mounting plate 11, and the projection portions 11b support the plate-shaped sample W. The diameter of the projection portion 11b is smaller than the thickness of the plate-shaped sample.

The thickness of the entirety including the mounting plate 11, the supporting plate 12, the electrode for electrostatic attraction 13, and the insulating material layer 14, that is, the thickness of the electrostatic chuck part 2 is 0.7 mm or more and 5.0 mm or less, as an example, and preferably 1.0 mm or more and 3.0 mm or less.

If the thickness of the electrostatic chuck part 2 falls below 0.7 mm, it becomes difficult to secure the mechanical strength of the electrostatic chuck part 2. If the thickness of the electrostatic chuck part 2 exceeds 5.0 mm, the thermal capacity of the electrostatic chuck part 2 is increased, and thus the thermal responsiveness of the plate-shaped sample W mounted thereon deteriorates, and due to an increase in the heat transfer in a lateral direction of the electrostatic chuck part, it becomes difficult to maintain the in-plane temperature of the plate-shaped sample W at a desired temperature pattern. The thickness of each part described here is an example and is not limited to the range described above.

The electrode for electrostatic attraction 13 is used as an electrostatic chucking electrode for generating electric charges and fixing the plate-shaped sample W with an electrostatic attraction force. The shape or size of the electrode for electrostatic attraction 13 is appropriately adjusted according to the use thereof.

The thickness of the electrode for electrostatic attraction 13 is not particularly limited. However, for example, the thickness of 0.1 µm or more and 100 µm or less can be selected, the thickness of 3 µm or more and 50 µm or less is preferable, and the thickness of 5 µm or more and 20 µm or less is more preferable.

If the thickness of the electrode for electrostatic attraction 13 falls below 0.1 µm, there is a case where it becomes difficult to secure sufficient electrical conductivity. If the thickness of the electrode for electrostatic attraction 13 exceeds 100 µm, cracking easily occurs in the joint interfaces between the electrode for electrostatic attraction 13, and the mounting plate 11 and the supporting plate 12 due to a difference in coefficient of thermal expansion between the electrode for electrostatic attraction 13, and the mounting plate 11 and the supporting plate 12.

A material of the electrode for electrostatic attraction 13 and a production method for the electrode for electrostatic attraction 13 will be described in detail later.

The insulating material layer 14 surrounds the electrode for electrostatic attraction 13 to protect the electrode for electrostatic attraction 13 from corrosive gas and plasma thereof, and joins and integrates a boundary portion between the mounting plate 11 and the supporting plate 12, that is, an outer peripheral portion region except for the electrode for electrostatic attraction 13. The insulating material layer 14 is formed of an insulating material having the same composition or the same main component as the material configuring the mounting plate 11 and the supporting plate 12.

(Temperature Adjusting Base Part)

The temperature adjusting base part 3 has a thick disk shape. The temperature adjusting base part 3 adjusts the temperature of the electrostatic chuck part 2 to a desired temperature. As the temperature adjusting base part 3, for example, a liquid-cooling base or the like, in which a flow path 3A for circulating a refrigerant is formed in the interior thereof, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as aluminum oxide formed thereon.

An insulating plate 7 is bonded to the upper surface side of the temperature adjusting base part 3 through an adhesion layer 6. The adhesion layer 6 is made of a sheet-shaped adhesive resin having heat resistance and insulation properties, such as polyimide resin, silicone resin, or epoxy resin. The adhesion layer is formed in a thickness in a range of about 5 to 100 μm, for example. The insulating plate 7 is made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulation properties, such as aluminum oxide.

(Focus Ring)

A focus ring 10 is a member that has a ring shape when viewed in a plan view and is placed on a peripheral portion of the temperature adjusting base part 3. The focus ring 10 is formed of, for example, a material having electrical conductivity equivalent to that of the wafer which is mounted on the mounting surface. By disposing the focus ring 10, it is possible to make an electrical environment with respect to plasma substantially coincide with that in the wafer at a peripheral portion of the wafer. Therefore, it is possible to make it difficult for a difference or bias in plasma treatment to occur between the central portion and the peripheral portion of the wafer.

(Other Members)

A power supply terminal 15 is connected to the electrode for electrostatic attraction 13. The power supply terminal 15 applies a direct-current voltage to the electrode for electrostatic attraction 13. The power supply terminal 15 is inserted into a through-hole 16 penetrating the temperature adjusting base part 3, the adhesive layer 8, and the supporting plate 12 in a thickness direction. An insulator 15a having insulation properties is provided on the outer periphery side of the power supply terminal 15. The power supply terminal 15 is insulated from the temperature adjusting base part 3 made of metal, by the insulator 15a.

In the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. Therefore, it is favorable if, for example, a portion which is inserted into the temperature adjusting base part 3 and a portion which is inserted into the supporting plate 12, of the power supply terminal 15, are made of different materials.

The portion connected to the electrode for electrostatic attraction 13 and inserted into the supporting plate 12, of the power supply terminal 15, is referred to as an extraction electrode, for convenience. The material of the extraction electrode is not particularly limited as long as it is a conductive material having excellent heat resistance. However, a material having a coefficient of thermal expansion which is close to the coefficients of thermal expansion of the electrode for electrostatic attraction 13 and the supporting plate 12 is preferable. The extraction electrode is made of a conductive ceramic material such as $Al_2O_3$—TaC, for example.

The portion inserted into the temperature adjusting base part 3, of the power supply terminal 15, is made of a metal material such as tungsten (W), tantalum (Ta), molybdenum (Mo), niobium (Nb), titanium (Ti), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The heater element 5 is obtained by processing a non-magnetic metal thin plate into a desired heater shape. As the non-magnetic metal thin plate, a known non-magnetic metal thin plate can be used as long as it has a constant thickness. The constant thickness as referred to herein is, for example, 0.2 mm or less, and preferably 0.1 mm or more. As the non-magnetic metal thin plate, for example, a titanium (Ti) thin plate, a tungsten (W) thin plate, a molybdenum (Mo) thin plate, or the like can be used. As a method of processing the non-magnetic metal thin plate into a heater element, a photolithography method, a laser processing method, or the like can be used. Further, a desired heater shape of the heater element 5 is, for example, a shape obtained by processing the entire contour of a meandering band-shaped conductive thin plate shape into an annular shape.

The heater element 5 may be provided by bonding a non-magnetic metal thin plate to the electrostatic chuck part 2 and then processing and forming the non-magnetic metal thin plate on the surface of the electrostatic chuck part 2. Further, the heater element 5 processed and formed at a position different from the electrostatic chuck part 2 may be provided by transfer-printing it onto the surface of the electrostatic chuck part 2.

The heater element 5 is bonded and fixed to the bottom surface of the supporting plate 12 by an adhesion layer 4 which is made of a sheet-shaped or film-shaped silicone resin or acrylic resin having a uniform thickness and having heat resistance and insulation properties.

A power supply terminal 17 for supplying electric power to the heater element 5 is connected to the heater element 5. As the material configuring the power supply terminal 17, the same material as the material configuring the power supply terminal 15 described above can be used. The power supply terminal 17 is provided so as to pass through a through-hole 3b formed in the temperature adjusting base part 3. That is, the power supply terminal 17 is disposed to partially penetrate the temperature adjusting base part 3, the insulating plate 7, and the adhesive layer 8 existing around them, in the thickness direction thereof. Further, a tubular insulator 18 for insulation is mounted on the outer peripheral surface of the power supply terminal 17, and thus the temperature adjusting base part 3 and the power supply terminal 17 are insulated from each other.

Further, a temperature sensor 20 is provided on the lower surface side of the heater element 5. In the electrostatic chuck device 1 of the present embodiment, an installation hole 21 is formed so as to penetrate the temperature adjusting base part 3 and the adhesion layer 6 in the thickness direction, and the temperature sensor 20 is installed at the uppermost portion of the installation hole 21. It is preferable that the temperature sensor 20 is installed at a position as close to the heater element 5 as possible. Therefore, the installation hole 21 may be formed to extend so as to protrude further toward the adhesive layer 8 side from the structure shown in the drawing such that the temperature sensor 20 and the heater element 5 are brought closer to each other.

The temperature sensor 20 is, for example, a fluorescent emission type temperature sensor in which a phosphor layer is formed on the upper surface side of a rectangular parallelepiped-shaped light transmission body made of quartz glass or the like. The temperature sensor 20 is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, a wide variety of fluorescent materials can be selected. The material for forming the phosphor layer is, as an example, a fluorescent material to which a rare earth element having an energy level suitable for light emission is added, a semiconductor material such as AlGaAs, metal oxide such as magnesium oxide, or a mineral such as ruby or sapphire, and can be used by being appropriately selected from these materials.

The temperature sensor 20 is provided at any position which does not interfere with the power supply terminal or the like and is in a circumferential direction of the lower surface of the heater element 5.

A temperature measurement part 22 measures the temperature of the heater element 5 from the fluorescence of the temperature sensor 20. The temperature measurement part 22 includes an excitation unit 23, a fluorescence detector 24, and a control unit 25, as an example. The excitation unit 23 irradiates the phosphor layer with excitation light on the outside (the lower side) of the installation hole 21 of the temperature adjusting base part 3. The fluorescence detector 24 detects the fluorescence emitted from the phosphor layer. The control unit 25 controls the excitation unit 23 and the fluorescence detector 24 and calculates the temperature of a main heater, based on the fluorescence.

Further, the electrostatic chuck device 1 has a pin insertion hole 28 which penetrates from the temperature adjusting base part 3 to the mounting plate 11 in the thickness direction thereof. A lift pin can be inserted through the pin insertion hole 28. By inserting the lift pin through the pin insertion hole 28, the plate-shaped sample mounted on the electrostatic chuck device 1 can be removed. A tubular insulator 29 is provided on an inner peripheral portion of the pin insertion hole 28.

Further, the electrostatic chuck device 1 has a gas hole (not shown) which penetrates from the temperature adjusting base part 3 to the mounting plate 11 in the thickness direction thereof. The gas hole can adopt the same configuration as the pin insertion hole 28, for example. Cooling gas for cooling the plate-shaped sample W is supplied to the gas hole. The cooling gas is supplied to grooves 19 formed between the plurality of projection portions 11b on the upper surface of the mounting plate 11 through the gas hole, and cools the plate-shaped sample W.

The electrostatic chuck device 1 has the configuration as described above.

Next, the electrode for electrostatic attraction 13 of the present embodiment will be described in detail.

The electrode for electrostatic attraction 13 of the present embodiment includes a composite sintered body which includes a matrix phase having insulation properties and a dispersed phase having a lower volume resistivity value than the matrix phase. The amount of the matrix phase which is included in the electrode for electrostatic attraction 13 can be optionally selected. However, it is preferably in a range of 10 to 90% by mass, and more preferably in a range of 30 to 70% by mass. That is, the amount of the dispersed phase which is included in the electrode for electrostatic attraction 13 can be optionally selected. However, it is preferably in a range of 10 to 90% by mass, and more preferably in a range of 30 to 70% by mass.

As the material for forming the matrix phase, aluminum oxide ($Al_2O_3$), yttrium oxide ($Y_2O_3$), yttrium aluminum garnet (YAG), samarium aluminate ($SmAlO_3$), aluminum nitride (AlN), silicon nitride ($Si_3N_4$), magnesium oxide (MgO), calcium oxide (CaO), titanium oxide ($TiO_2$), zirconium oxide ($ZrO_2$), or the like can be given.

The matrix phase may include at least one material which is selected from these forming materials. The matrix phase may be composed of at least one of the forming materials.

For example, the matrix phase may be substantially composed of only aluminum oxide and may be a mixture of aluminum oxide, yttrium oxide, and yttrium aluminum garnet. The matrix phase being substantially composed of only aluminum oxide may be, for example, the amount of aluminum oxide being 90 parts by mass or more of the amount of the matrix phase.

As long as it includes metal carbide and silicide, the material for forming the dispersed phase can be appropriately selected. As the material for forming the dispersed phase, metal carbide such as tantalum carbide ($Ta_4C_5$) or molybdenum carbide ($Mo_2C$), and silicide such as silicon carbide or silicon oxide can be given.

The dispersed phase is formed of these forming materials, for example. Therefore, the dispersed phase may be substantially composed of only molybdenum, carbon, and silicon. The expression "being substantially composed of only molybdenum, carbon, and silicon" as referred to herein means, for example, that 90 parts by mass or more of the amount of the dispersed phase is composed of molybdenum, carbon, and silicon.

It is considered that the electrode for electrostatic attraction 13 of the present embodiment includes a product obtained by reaction of metal carbide and silicon in the dispersed phase. If EPMA measurement is performed on the composite sintered body that configures the electrode for electrostatic attraction 13, it can be confirmed that silicon atoms are also present at the same positions as the positions where metal atoms and carbon that configure the metal carbide are present. Therefore, although details of the product are unclear, it is considered that an element configuring the metal carbide that is a raw material and a silicon atom configuring the silicide react with each other to be detected at the same position in the EPMA measurement.

In the electrode for electrostatic attraction 13, it is preferable that aluminum oxide, molybdenum carbide, and silicide are used as starting materials for the composite sintered body, aluminum oxide is included in the matrix phase, and molybdenum, carbon, and silicon are included in the dispersed phase.

In such a composite sintered body, in any cross section, a region of the dispersed phase, which is surrounded by the matrix phase and is independent, includes aggregated portions having the maximum Feret diameter of 30 μm or more. That is, an aggregated portion composed of a dispersed phase and having the maximum Feret diameter of 30 μm or more is formed. The aggregated portion may be an aggregate formed by particulate sintering. The aggregated portion may be considered as one aggregated portion if it is continuous, and may have a shape such as a continuous amorphous shape, for example.

The maximum Feret diameter of the region of the dispersed phase can be measured by image-analyzing an SEM image which is obtained by the EPMA measurement described above. The maximum Feret diameter may mean the maximum value of the interval between two parallel lines when a measurement region is sandwiched between the two parallel lines.

The maximum Feret diameter of the region of the dispersed phase is preferably 40 μm or more, and more preferably 50 μm or more.

Further, in such a composite sintered body, one or more aggregated portions described above are present in the range of 2500 μm$^2$ in any cross section.

In such a composite sintered body, it is considered that the aggregated portions each having the maximum Feret diameter of 30 μm or more, which are included in the dispersed phase, form a network to improve electrical conductivity. Therefore, such a composite sintered body has a low volume resistivity, compared to a composite sintered body which does not include the aggregated portions described above and in which a network showing electrical conductivity is not formed.

If the content ratio of the metal carbide with respect to the material for forming the matrix phase increases, the volume resistivity tends to decrease.

[Production Method for Electrostatic Chuck Device]

A production method for an electrostatic chuck device according to the present embodiment includes a step of preparing mixed particles in which silicon carbide particles and/or silicon oxide particles are further added to a mixture of aluminum oxide particles and molybdenum carbide particles, a step of forming the mixed particles to obtain a formed body, and a step of sintering the formed body.

The sintered body obtained through the above steps can be preferably used for an electrode for electrostatic attraction or the like.

First, mixed particles as a starting material are prepared.

The electrostatic chuck device which is produced by the production method for an electrostatic chuck device according to the present embodiment is mainly used in a semiconductor manufacturing apparatus. From the viewpoint of suppressing a decrease in yield in the semiconductor manufacturing apparatus, it is preferable that each starting material which is used in the production method for an electrostatic chuck device has high purity.

For example, in the production method for an electrostatic chuck device according to the present embodiment, it is preferable that the aluminum oxide particles which are used have an aluminum oxide content of 99.99% or more. Such high-purity aluminum oxide particles can be prepared by using an alum method.

In the aluminum oxide particles prepared by using the alum method, the content of sodium atoms which are metal impurities can be significantly reduced compared to aluminum oxide particles prepared by using, for example, a Bayer method. Further, as long as aluminum oxide particles having a desired purity can be obtained, various methods can be adopted.

Further, the particle diameter of the aluminum oxide particle which is used can be optionally selected. However, the average particle diameter is preferably 0.05 μm or more and 0.5 μm or less, and more preferably 0.08 μm or more and 0.3 μm or less. The aluminum oxide particles having such an average particle diameter are preferable because they are easily dispersed at the time of the preparation of the mixed particles and homogeneous mixed particles are obtained.

Further, the particle diameter of the molybdenum oxide particle which is used can be optionally selected. However, the average particle diameter is preferably 0.05 μm or more and 1.0 μm or less, and more preferably 0.1 μm or more and 0.6 μm or less. The molybdenum oxide particles having such an average particle diameter are preferable because they are easily dispersed at the time of the preparation of the mixed particles and homogeneous mixed particles are obtained.

Further, the particle diameter of the silicon carbide particle which is used can be optionally selected. However, the average particle diameter is preferably 0.01 μm or more and 0.1 μm or less, and more preferably 0.02 μm or more and 0.06 μm or less. The silicon carbide particles having such an average particle diameter are preferable because they are easily dispersed at the time of the preparation of the mixed particles and homogeneous mixed particles are obtained.

Further, the particle diameter of the silicon oxide particle which is used can be optionally selected. However, the average particle diameter is preferably 0.01 μm or more and 0.1 μm or less, and more preferably 0.02 μm or more and 0.05 μm or less. The silicon oxide particles having such an average particle diameter are preferable because they are easily dispersed at the time of the preparation of the mixed particles and homogeneous mixed particles are obtained.

In the present embodiment, the average particle diameter of each starting material is the average particle diameter of primary particles of each starting material, and a volume average particle diameter measured by a laser diffraction/scattering method is adopted.

The amount of the raw material particles can be optionally selected. For example, the amount of aluminum oxide particles is preferably 10 to 90 parts by mass, and more preferably 30 to 60 parts by mass, with respect to the total amount of aluminum oxide particles, molybdenum carbide, and silicon carbide and/or silicon oxide.

The amount of molybdenum carbide is preferably 10 to 90 parts by mass, and more preferably 10 to 70 parts by mass, with respect to the total amount of aluminum oxide particles, molybdenum carbide, and silicon carbide and/or silicon oxide.

The amount of silicon carbide and/or silicon oxide is preferably 1 to 30 parts by mass, and more preferably 5 to 20 parts by mass, with respect to the total amount of aluminum oxide particles, molybdenum carbide, and silicon carbide and/or silicon oxide.

In a mixing step, the silicon carbide particles and/or the silicon oxide particles and a dispersion medium are further added to the aluminum oxide particles and the molybdenum carbide particles, and then they are uniformly mixed using a ball mill. Specifically, a ball mill using a medium made of aluminum oxide and having a diameter of 1 mm or more and 5 mm or less is used, and the above particles are uniformly mixed by stirring and mixing at a rotation speed and a stirring time suitable for the size of a dispersion pot. The rotation speed and stirring time of the ball mill are determined according to the amount of the raw material which is used, the size of the dispersion pot, or the diameter and amount of the medium which is used. The rotation speed and stirring time of the ball mill may be determined by appropriately performing preliminary experiments.

Subsequently, the obtained dispersion liquid is spray-dried to obtain granules composed of mixed particles in which the silicon carbide particles and/or the silicon oxide particles are further mixed in the aluminum oxide particles and the molybdenum carbide particles.

Subsequently, in the step of obtaining a formed body, the obtained granules are uniaxially formed (formed with uniaxial press) according to the shape of a target sintered body to obtain a formed body.

Subsequently, the formed body described above is heated to a temperature of 400° C. or higher and 1300° C. or lower in a vacuum atmosphere. The temperature is more preferably 600° C. or higher and 1300° C. or lower, and further preferably 800° C. or higher and 1250° C. or lower. This step corresponds to a first heat treatment step. The first heat treatment step may be carried out without applying pressure with uniaxial press, or may be carried out while applying pressure with uniaxial press. The heating time can be optionally selected. However, as an example, it may be in a range of 1 to 10 hours, or the like.

After the first heat treatment step, a second heat treatment step of heating the formed body to a temperature of 1500° C. or higher in an inert gas atmosphere is included. The temperature is more preferably 1500° C. or higher and 1850° C. or lower, and further preferably 1600° C. or higher and 1800° C. or lower. The heating time can be optionally selected. However, as an example, it may be in a range of 1 to 10 hours, or the like.

According to the first heat treatment step, metal impurities such as alkali metal contained in the mixed particles are evaporated by appropriately setting the temperature at the time of preliminary heating, and thus the metal impurities can be easily removed. Therefore, according to the first heat treatment step, the purity of the mixed particles is easily improved, and the volume resistivity value of the obtained composite sintered body is lowered.

In the present embodiment, the term "vacuum" refers to a "state in a space filled with gas at pressure lower than the atmospheric pressure" and a state defined as an industrially usable pressure in the JIS standard. In the present embodiment, the vacuum atmosphere may be low vacuum (100 Pa or more). However, medium vacuum (in a range of 0.1 Pa to 100 Pa) is preferable, and high vacuum (in a range of $10^{-5}$ Pa to 0.1 Pa) is more preferable.

In the production method for an electrostatic chuck device of the present embodiment, for example, after heating is performed at 1200° C. for 2 hours or more under a vacuum atmosphere, air pressure is returned to the atmospheric pressure with argon.

Subsequently, the formed body subjected to the preliminary heating is sintered by heating it to a temperature of 1500° C. or higher while compacting it with a pressure of 2 MPa or more in an inert gas atmosphere. According to such an operation, sintering of the aluminum oxide particles, the molybdenum carbide particles, the silicon carbide particles, and the silicon oxide particles included in the formed body progresses, and thus a dense sintered body with few pores is obtained.

In the production method for an electrostatic chuck device of the present embodiment, for example, the aluminum oxide particles, the molybdenum carbide particles, the silicon carbide particles, and the silicon oxide particles included in the formed body are sintered at a temperature of 1500° C. or higher and 1850° C. or lower and a sintering pressure of 2 MPa or more and 20 MPa or less under an argon atmosphere. By setting the sintering temperature to 1850° C. or lower, it is possible to suppress evaporation of aluminum oxide.

In the composite sintered body obtained by being produced by such a method, it is considered that during the sintering, the silicide such as silicon carbide or silicon oxide reacts on the surface of molybdenum carbide to produce molybdenum silicide. In the molybdenum carbide particle with molybdenum silicide produced on the surface thereof, the inter-particle sintering is promoted by the molybdenum silicide on the surface. As a result, in the dispersed phase, one or more of the aggregated portions having the maximum Feret diameter exceeding 30 µm grows, and thus a composite sintered body having a low volume resistivity is obtained.

Subsequently, the obtained composite sintered body is appropriately ground to form a desired electrode for electrostatic attraction.

According to the electrostatic chuck device having the configuration as described above, it is possible to provide an electrostatic chuck device having a novel electrode for electrostatic attraction which has a low volume resistivity.

Further, according to the production method for an electrostatic chuck device as described above, it is possible to provide a production method for an electrostatic chuck device, which makes it possible to easily produce an electrode for electrostatic attraction having a low volume resistivity.

The preferred embodiment example of the present invention has been described above with reference to the accompanying drawings. However, it goes without saying that the present invention is not limited to such an example. The shapes, combinations, and the like of the constituent members shown in the example described above are merely examples, and various changes can be made based on design requirements or the like within a scope which does not depart from the gist of the present invention.

EXAMPLE

The present invention will be described below with reference to examples. However, the present invention is not limited to these examples.

(Measurement of Volume Resistivity Value)

In this example, the volume resistivity value of a disk-shaped sintered body was measured by the measurement method according to JIS K7194.

Specifically, a disk-shaped test piece having a diameter of 48 mm and a thickness of 4 mm was cut out from a composite sintered body which is obtained by the method which will be described later, and the volume resistivity of this test piece was measured by four point measurements using a resistivity meter (Loresta GP manufactured by Mitsubishi Chemical Analytech). Here, a measurement voltage was set to be 90 V.

[Analysis of Element Distribution of Composite Sintered Body]

With respect to the composite sintered body which is obtained by the method which will be described later, a cross section orthogonal to the pressing axis direction at the time of sintering was formed, and then the cross section was mirror-polished. Subsequently, the surface analysis of SiKα, CKα, and MoLα was performed with respect to molybdenum, carbon, and silicon of the cross section by an EPMA (Electron Probe Micro Analyzer).

The "region in which molybdenum is present" and the "region in which carbon is present" were determined to be dispersed phases having electrical conductivity.

(Measurement Conditions)

Measurement instrument: JXA-8800 manufactured by JEOL Ltd.

Measurement range: 50 μm×50 μm

Accelerating voltage: 15 kV

Measurement magnification: 500 times

The maximum Feret diameters of the regions in which molybdenum and carbon are present were measured with respect to optional 10 locations within a visual field having a size of 50 μm×50 μm square, in an SEM image that is a magnified image (500 times) obtained by EPMA measurement.

In the measurement of the maximum Feret diameters of the "region in which molybdenum is present" and the "region in which carbon is present", the boundary between the regions to be measured was clarified by binarizing the SEM image in advance. Further, the maximum Feret diameter was determined with respect to the entirety of the "region in which molybdenum is present" and the "region in which carbon is present" included within a visual field.

In the measurement, with respect to a particle crossing the measurement region of 50 μm×50 μm with one particle, the maximum Feret diameter was set to be ">50 μm".

Further, a basic operation in the measurement was based on the method described in JIS Z8827-1 "Particle diameter analysis-image analysis method-Part 1: Static image analysis method".

Example 1

As starting materials, 40 parts by mass of aluminum oxide ($Al_2O_3$) particles (manufactured by Daimei Chemical Industry Co., Ltd., average particle diameter: 0.2 μm), 50 parts by mass of molybdenum carbide ($Mo_2C$) particles (manufactured by Nippon Shinkin Co., Ltd., average particle diameter: 0.5 μm), and 10 parts by mass of silicon carbide (SiC) particles (manufactured by Sumitomo Osaka Cement Co., Ltd., average particle diameter: 0.05 μm) were used.

40 parts by mass of $Al_2O_3$ particles, 50 parts by mass of $Mo_2C$ particles, 10 parts by mass of SiC particles, and 150 parts by mass of 2-propanol were mixed. The obtained mixture was dispersed using a ball mill and then dried by spray drying to obtain mixed particles. Specifically, a ball mill using a medium made of aluminum oxide and having a diameter of 1 mm or more and 5 mm or less was used, and dispersion was performed for 12 hours at a rotation speed suitable for the size of a dispersion pot.

The mixed particles were formed with uniaxial press at a press pressure of 5 MPa by a die forming method to obtain a formed body having a diameter of 50 mm and a thickness of 6 mm.

The obtained formed body was set in a graphite mold and pressure-sintered. First, the formed body was heated from room temperature to 1200° C. at a temperature rising rate of 10° C./min in a vacuum atmosphere without applying a press pressure. After the heating temperature reached 1200° C., the temperature was maintained for 2 hours, and thereafter, the formed body was sintered by maintaining it at a press pressure of 10 MPa and a temperature of 1800° C. for 3 hours in an argon atmosphere having an atmospheric pressure, thereby obtaining a sintered body of Example 1.

Example 2

A sintered body of Example 2 was obtained in the same manner as in Example 1 except that silicon oxide particles (manufactured by Nippon Aerosil Co., Ltd., average particle diameter: 0.03 μm) were used instead of the silicon carbide particles.

Comparative Example 1

A sintered body of Comparative Example 1 was obtained in the same manner as in Example 1 except that when pressure-sintering the formed body obtained with uniaxial press, a temperature was raised from room temperature to 1800° C. at a press pressure of 10 MPa in an argon atmosphere having an atmospheric pressure, without performing heating from room temperature to 1200° C. in a vacuum atmosphere.

Reference Example

A sintered body of a reference example was obtained in the same manner as in Comparative Example 1 except that a mixture of 40 parts by mass of $Al_2O_3$ particles, 60 parts by mass of $Mo_2C$ particles, and 150 parts by mass of 2-propanol was dispersed in a ball mill without using SiC particles as a starting material.

Figure 2:
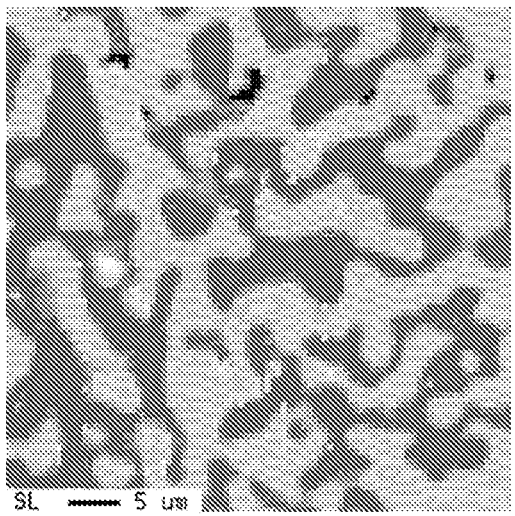
FIG. 2 is an SEM image obtained by EPMA measurement and surface analysis images of Mo, Si, and C elements with respect to a sintered body of Example 1.
Figure 2:
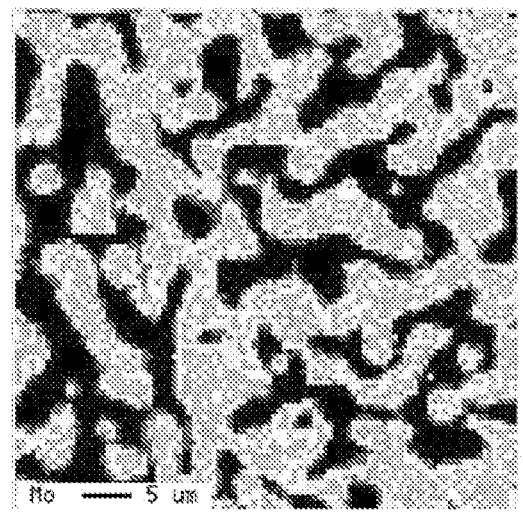
Figure 2:
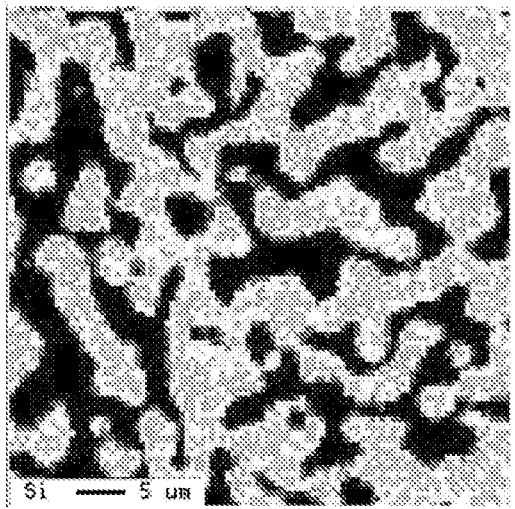
Figure 2:
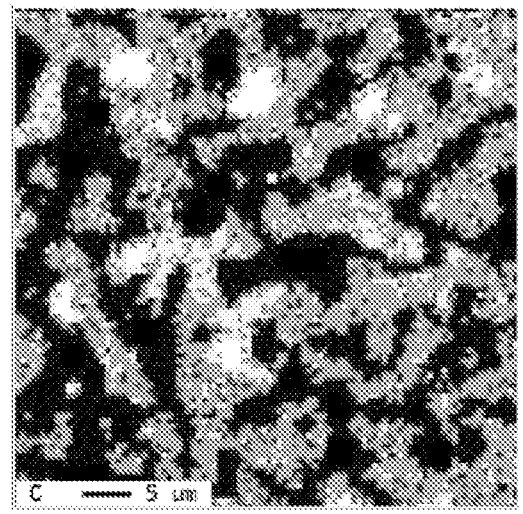
Figure 3:
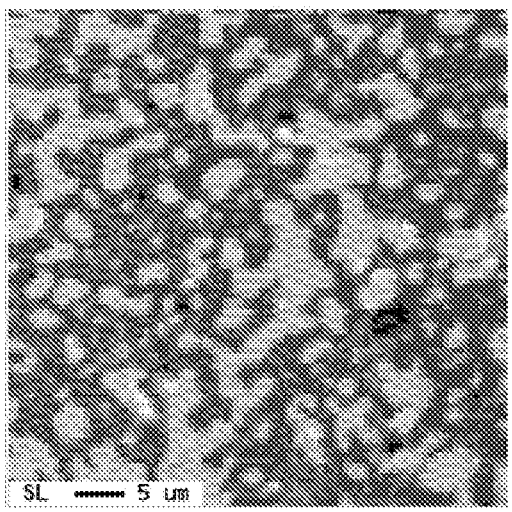
FIG. 3 is an SEM image obtained by EPMA measurement and surface analysis images of Mo, Si, and C elements with respect to a sintered body of Comparative Example 1.
Figure 3:
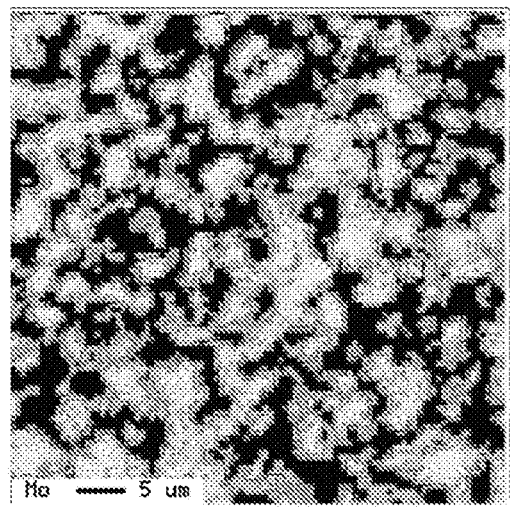
Figure 3:
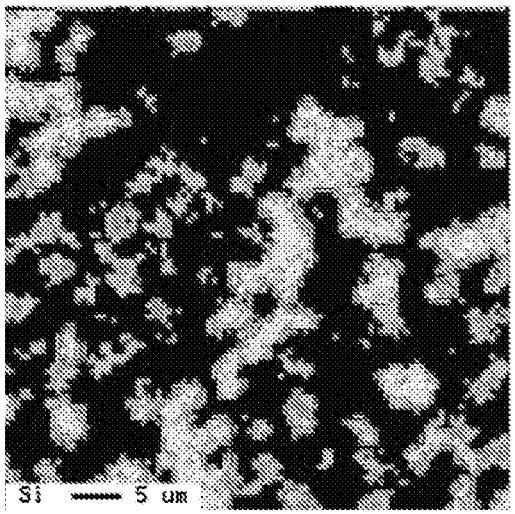
Figure 3:
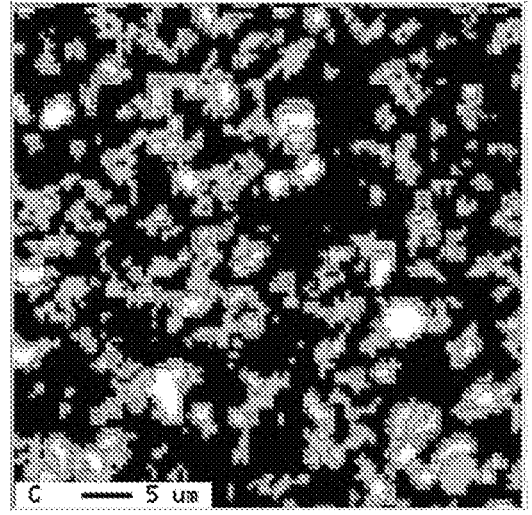
Figure 4:
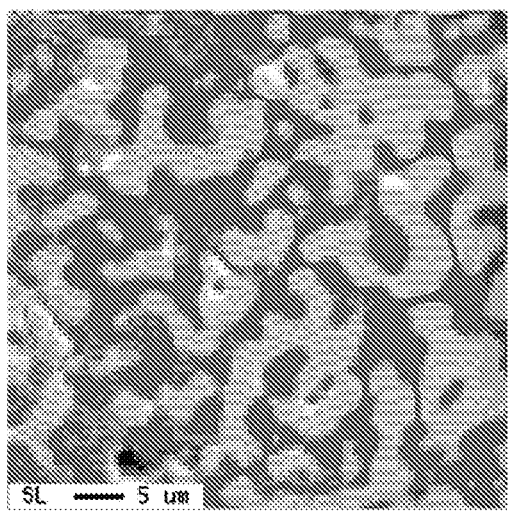
FIG. 4 is an SEM image obtained by EPMA measurement and surface analysis images of Mo, Si, and C elements with respect to a sintered body of a reference example.
Figure 4:
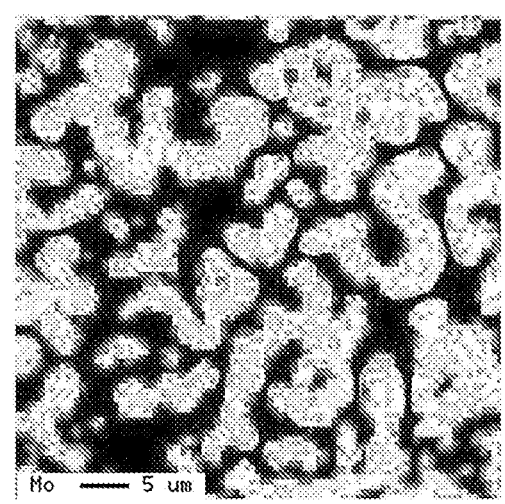
Figure 4:
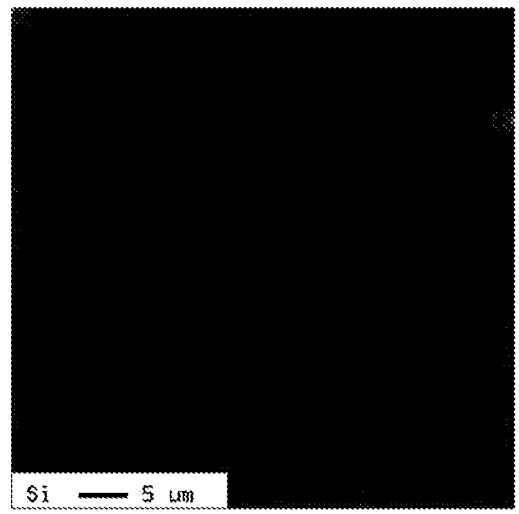
Figure 4:
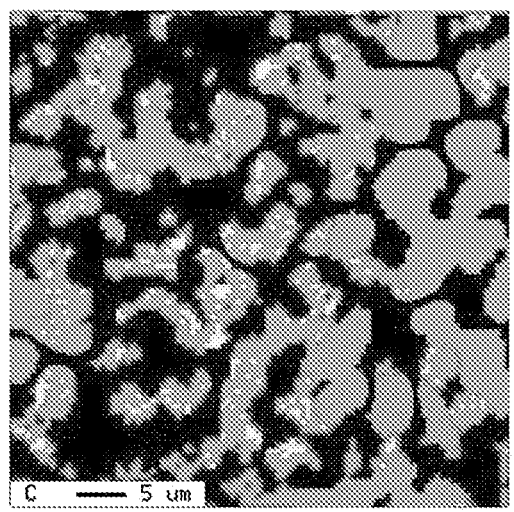

FIGS. 2 to 4 are SEM images obtained by the EPMA measurement, and surface analysis images in the same visual field as in the SEM image, of Example 1 (FIG. 2), Comparative Example 1 (FIG. 3), and the reference example (FIG. 4).

In each of the drawings, the SEM image and element distributions of Mo, C, and Si are shown.

In the SEM image, a relatively black portion is the matrix phase and a relatively white portion is the dispersed phase.

Further, in the surface analysis image, it is shown that an element to be analyzed is not present in a black region and an element to be analyzed is present in a relatively white region.

The comparison of the conditions of the examples and the comparative example is shown in Table 1, and the measurement results are shown in Table 2. The "vacuum heat treatment" in the table refers to an operation of heating a formed body obtained with uniaxial press from room temperature to 1200° C. in a vacuum atmosphere. In Table 2, the maximum values among the maximum Feret diameters of the "region in which molybdenum is present" and the "region in which carbon is present" which are included in the measurement regions are shown.

TABLE 1

|  | Amount of $Al_2O_3$ (part by mass) | Amount of $Mo_2C$ (part by mass) | Amount of SiC (part by mass) | Amount of $SiO_2$ (part by mass) | Presence or absence of vacuum heat treatment |
|---|---|---|---|---|---|
| Example 1 | 40 | 50 | 10 | — | Presence |
| Example 2 | 40 | 50 | — | 10 | Presence |
| Comparative Example 1 | 40 | 50 | 10 | — | Absence |
| Reference example | 40 | 60 | — | — | Absence |

TABLE 2

|  | Maximum Feret diameter (μm) | Volume resistivity (×10$^{-5}$ Ω·cm) |
|---|---|---|
| Example 1 | >50 | 35 |
| Example 2 | >50 | 39 |
| Comparative Example 1 | 22 | 185 |
| Reference example | 25 | 80 |

As a result of the evaluation, it was confirmed that the maximum Feret diameter of the dispersed phase of each of the sintered bodies of Examples 1 and 2 was larger than 50 μm and the respective values were larger than that in the reference example. The volume resistivity value of each of the sintered bodies of Examples 1 and 2 was lowered compared to the volume resistivity value of the sintered body of the reference example.

Further, in Examples 1 and 2, vacuum heat treatment was carried out at the time of the production of the sintered body. It is considered that as a result of removal of the impurities on the surfaces of the $Mo_2C$ particles due to this vacuum heat treatment, the reaction between the $Mo_2C$ particles and the surrounding SiC particles or $SiO_2$ particles is promoted, and as a result of promoting the formation of the network of the $Mo_2C$ particles, the volume resistivity is lowered.

On the other hand, in the dispersed phase in Comparative Example 1 in which the raw material having the same composition as that in Example 1 was used as a starting material, the maximum Feret diameter was equal to or less than that in the reference example. The volume resistivity value of the sintered body of Comparative Example 1 was greatly increased compared to the volume resistivity value of the sintered body of the reference example.

Since SiC particles are carbides and are substances that are difficult to be sintered, they may become a factor to increase crystal grain boundaries. Therefore, in Comparative Example 1 in which SiC particles were simply added to the composition of the reference example and vacuum heat treatment was not performed, it is considered that the formation of the network of the $Mo_2C$ particles is hindered due to the added SiC particles, leading to an increase in the volume resistivity.

From the above results, it was found that the present invention is useful.

REFERENCE SIGNS LIST

1: electrostatic chuck device
11: mounting plate (base)
11a: mounting surface
12: supporting plate (base)
13: electrode for electrostatic attraction
W: plate-shaped sample

The invention claimed is:

1. An electrostatic chuck device comprising:
a base having one main surface serving as a mounting surface on which a plate-shaped sample is mounted; and
an electrode for electrostatic attraction provided on a side opposite to the mounting surface in the base or in an interior of the base,
wherein the electrode for electrostatic attraction is made of a composite sintered body that includes a matrix phase having insulation properties and a dispersed phase having a lower volume resistivity value than the matrix phase, and
wherein the dispersed phase of the composite sintered body comprises a plurality of aggregated portions comprising metal, silicon, and carbon, the aggregated portions each having a Maximum Feret Diameter of 30 μm or more, the Maximum Feret Diameter being the maximum value of the interval between two parallel lines when a measurement region of each aggregated portion is sandwiched between the two parallel lines.

2. The electrostatic chuck device according to claim 1, wherein the matrix phase includes aluminum oxide.

3. The electrostatic chuck device according to claim 1, wherein the dispersed phase includes molybdenum as the metal.

4. The electrostatic chuck device according to claim 1, wherein a thickness of the electrode for electrostatic attraction is 0.1 μm or more and 100 μm or less.

5. The electrostatic chuck device according to claim 1, wherein the matrix phase is composed of one or more of aluminum oxide ($Al_2O_3$), yttrium oxide ($Y_2O_3$), yttrium aluminum garnet (YAG), samarium aluminate ($SmAlO_3$), aluminum nitride (AlN), silicon nitride ($Si_3N_4$), magnesium oxide (MgO), calcium oxide (CaO), titanium oxide ($TiO_2$), and zirconium oxide ($ZrO_2$).

6. The electrostatic chuck device according to claim 1, wherein the dispersed phase comprises metal carbide and metal silicide.

7. The electrostatic chuck device according to claim 1, wherein the matrix phase is substantially composed of aluminum oxide.

8. The electrostatic chuck device according to claim 1, wherein the dispersed phase is substantially composed of molybdenum, carbon, and silicon.

9. A production method for the electrostatic chuck device according to claim 1, the method comprising:
a step of preparing mixed particles in which one or both of silicon carbide particles and silicon oxide particles are further added to a mixture of aluminum oxide particles and molybdenum carbide particles;
a step of forming the mixed particles to obtain a formed body;
a first heat treatment step of heating the formed body to a temperature of 400° C. or higher and 1300° C. or lower in a vacuum atmosphere; and
a second heat treatment step of heating the formed body to a temperature of 1500° C. or higher in an inert gas atmosphere after the first heat treatment step to obtain a composite sintered body.

10. The electrostatic chuck device according to claim 1, wherein the amount of the matrix phase is in a range of 30 to 70% by mass.

11. The production method for the electrostatic chuck device according to claim 9, further comprising a step of grinding the composite sintered body to obtain an electrode for electrostatic attraction.

12. The production method for the electrostatic chuck device according to claim 9, wherein the second heat treatment step of heats the formed body to a temperature of 1500° C. to 1850° C. and a sintering pressure of 2 MPa or more and 20 MPa or less.

13. The electrostatic chuck device according to claim 1, wherein the Maximum Feret Diameter is $50 \times 2^{1/2}$ or less.

14. The electrostatic chuck device according to claim 1, wherein the Maximum Feret Diameter is 50 μm or less.

15. The electrostatic chuck device according to claim 1, wherein the dispersed phase includes metal carbide.

16. The electrostatic chuck device according to claim 1, wherein a surface of the electrode comprises one or more of the aggregated portions with a size of about 2500 μm².

17. The electrostatic chuck device according to claim 1, wherein a cross section of the electrode comprises one or more of the aggregated portions with a size of about 2500 μm².

18. The electrostatic chuck device according claim 15, wherein a number of the aggregated portions is counted using an SEM image of the surface.

\* \* \* \* \*